United States Patent [19]
Lee

[11] Patent Number: 5,436,577
[45] Date of Patent: Jul. 25, 1995

[54] CMOS TRI-STATE BUFFER CIRCUIT AND OPERATION METHOD THEREOF

[75] Inventor: Cheol-Hee Lee, Daegu, Rep. of Korea

[73] Assignee: Goldstar Electron Co., Ltd., Cheongju, Rep. of Korea

[21] Appl. No.: 97,256

[22] Filed: Jul. 23, 1993

[30] Foreign Application Priority Data
Jul. 25, 1992 [KR] Rep. of Korea ............... 1992-13377

[51] Int. Cl.[6] ........................................... H03K 19/00
[52] U.S. Cl. ........................................ 326/58; 326/121
[58] Field of Search .................. 307/443, 451, 473; 326/58, 121

[56]     References Cited
U.S. PATENT DOCUMENTS

| 4,638,187 | 1/1987 | Boler | 307/473 |
|---|---|---|---|
| 4,827,159 | 5/1989 | Naganuma | 307/451 |
| 4,985,644 | 1/1991 | Okihara et al. | 307/443 |
| 4,985,646 | 1/1991 | Kumagai | 307/451 |
| 5,059,823 | 10/1991 | Ahsanullah | 307/443 |
| 5,206,544 | 4/1993 | Chen et al. | 307/451 |
| 5,239,211 | 8/1993 | Jinbo | 307/443 |
| 5,315,173 | 5/1994 | Lee | 307/451 |

Primary Examiner—Edward P. Westin
Assistant Examiner—Andrew Sanders
Attorney, Agent, or Firm—Alan R. Loudermilk

[57]     ABSTRACT

A 3-state buffer circuit applicable for a CMOS output drive circuit is disclosed. The output circuit provides reduced ground noise and delay time of an output signal by decreasing a counter-electromotive force generated upon turning ON of the output transistor. The circuit includes a subsidiary drive circuit for applying a voltage less than the power source Vcc to a gate of an NMOS transistor connected on the ground side of the drive circuit so that generation of the counter-electromotive force is minimized.

7 Claims, 2 Drawing Sheets

CMOS TRI-STATE BUFFER CIRCUIT AND OPERATION METHOD THEREOF

FIELD OF THE INVENTION

The present invention relates to buffer circuits, and more particularly to a CMOS tri-state or 3-state buffer circuit and operation method thereof with a reduced counter-electromotive force.

BACKGROUND OF THE INVENTION

An example of a conventional CMOS tri-state or 3-state buffer circuit is shown in FIG. 1. Driving circuit 30 has transistors FET1 and FET2 connected in series for driving an output load through output terminal 40, first control circuit 20 having invertors I1 and I2 and NOR gate N1 for controlling transistor FET1 of driving circuit 30, and second control circuit 10 having NAND gate N2 and invertor I3 for controlling FET2 of driving circuit 30.

Data D is applied through invertor I4 to an input of both NOR gate N1 and NAND gate N2, and control signal C is applied to invertor I1 and another input of NAND gate N2.

The conventional 3-state buffer circuit is operated in such a manner that, when 3-state control signal C is at a "low" level, the output of first control circuit 20 becomes a "high" level and the output of second control circuit 10 becomes a "low" level, whereby output transistors FET1 and FET2 are respectively controlled to be in the OFF state. In this state, output terminal 40 remains in a high impedance state by the low level of control signal C regardless of the state of data D.

On the other hand, when 3-state buffer control signal C is at a "high" level, since the output of invertor I1 becomes a "low" level, NOR gate N1 and NAND gate N2 are both put in an enabled state, and output terminal 40 follows input data D; that is, output terminal 40 becomes a "high" level if input data D is at a "high" level, and output terminal 40 becomes a "low" level if input data D is at a "low" level.

In this conventional 3-state buffer circuit, generally transistors FET1 and FET2 of driving circuit 30 must have a large current driving ability for driving quickly a capacitor CL of the output load connected to output terminal 40.

Particularly, in a chip having many output terminals 40, large sink current typically flows to the ground line. As a result, a large counter-electromotive force Vn is induced as shown in FIG. 2, which can act to pull up the voltage of the ground line, whereby an output delaying effect can occur as shown in FIG. 3. Here, inductance L causing the counter-electromotive force is the sum of inductances such as the inductances of the connecting lines and lead frame and the like within the chip, and this inductance L generally is unavoidable in the semiconductor chip. The resulting counter-electromotive force effectively becomes a source of ground noise.

In order to reduce such ground noise, one conventional 3-state buffer circuit operation method is that invertor I3 is designed to have decreased current driving ability, thereby turning on slowly output transistor FET2. Thus, the di/dt value is decreased.

Another operation method for a 3-state buffer circuit is to divide transistor FET2 so that multiple transistors are provided instead of single transistor FET2, with each transistor turning on in sequence with a time delay, thereby reducing the di/dt value.

However, it remains difficult to reduce the counter-electromotive force and to lessen the transfer time of the data from the input side to the output terminal.

SUMMARY OF THE INVENTION

In order to solve the problems described above, the present invention provides a subsidiary drive circuit to control transistor FET2 connected to the ground side of the driving circuit, and through this subsidiary circuit a voltage less than the power source Vcc is applied to the gate of output transistor FET2. Thus, when transistor FET2 turns on, transistor FET2 provides larger resistance in the current sink circuit, and thereby the counter-electromotive forces are reduced.

An object of the present invention is to provide a CMOS 3-state buffer circuit for driving an output load connected to an output terminal, which includes: a drive circuit having a PMOS transistor and an NMOS transistor connected in series for providing a driving current to an output load through the output terminal; a first control circuit including a first invertor, a NOR gate, and a second invertor connected in series for controlling the PMOS transistor of the drive circuit; a second control circuit including a NAND gate and a third invertor connected in series for controlling the NMOS transistor of the drive circuit; a data input terminal connected through a fourth invertor to one input terminal of the NOR gate and the NAND gate, a control input terminal connected to the other terminal of the NAND gate and through the first invertor to the other input terminal of the NOR gate. The present invention further includes a subsidiary drive circuit which is connected between the second control circuit and the NMOS transistor of the drive circuit, the subsidiary drive circuit providing a voltage of less than a power source voltage Vcc to the gate of the NMOS transistor of the drive circuit.

The subsidiary drive circuit preferably comprises two NMOS transistors connected in series, with an output of the third invertor of the second control circuit connected to the gate of a first of the two transistors, and an output terminal of the NAND gate of the second control circuit connected to the gate of a second of the two transistors, and with an output terminal of the subsidiary drive circuit connected to the gate of the NMOS output transistor of the drive circuit.

Another object of the present invention is to provide an operation method for controlling a CMOS 3-state buffer circuit for reducing a counter-electromotive force by providing a voltage less than the power source voltage Vcc to the gate of an NMOS transistor connected on the ground side of the drive circuit.

BRIEF DESCRIPTION OF THE DRAWINGS

The above object and other advantages of the present invention will become more apparent by describing in detail the preferred embodiments of the present invention with reference to the attached drawings in which:

FIG. 5 (b) illustrates output transistor operation with the present invention.

DESCRIPTION OF THE PREFERRED EMBODIMENTS

Figure 1:
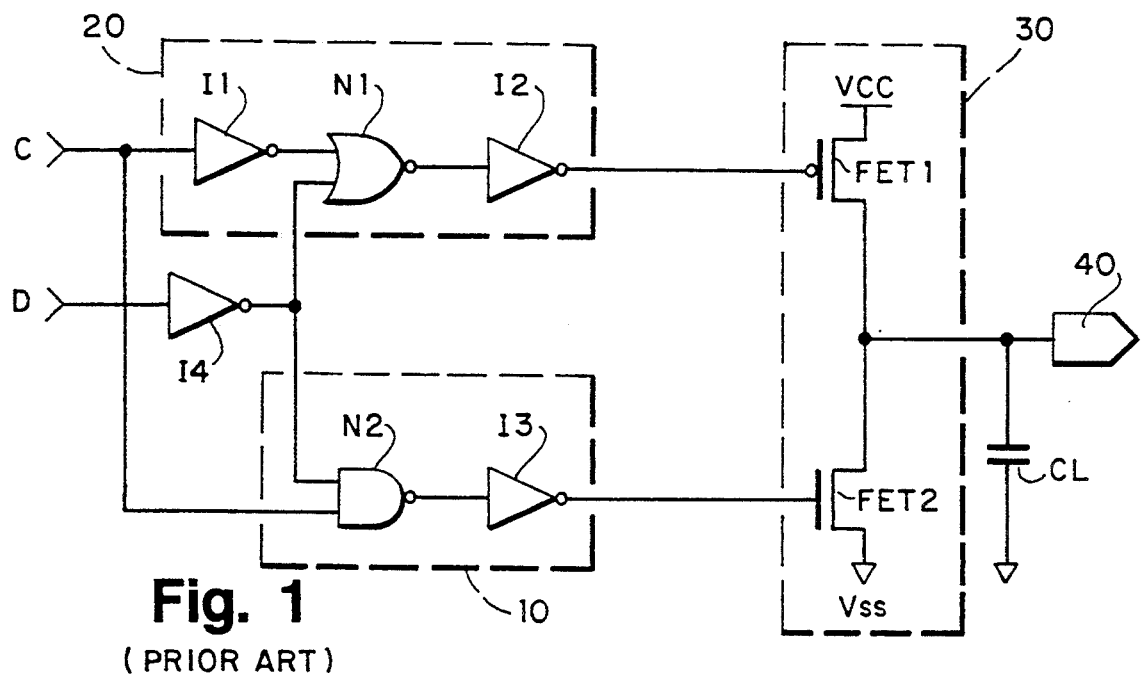
FIG. 1 is circuit diagram of a conventional CMOS 3-state buffer circuit.
Figure 2:
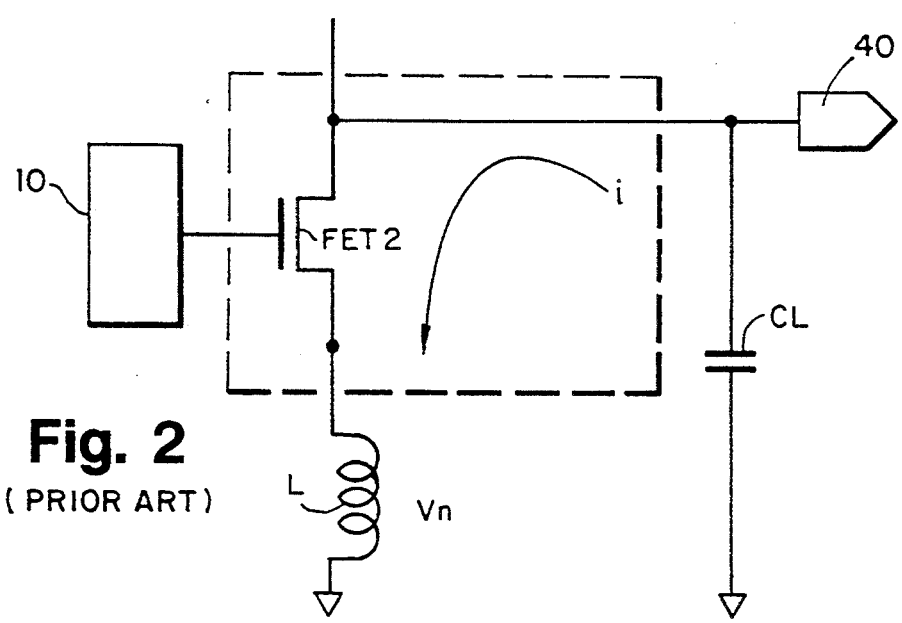
FIG. 2 illustrates a counter-electromotive force induced in the conventional CMOS 3-state buffer circuit.
Figure 3:
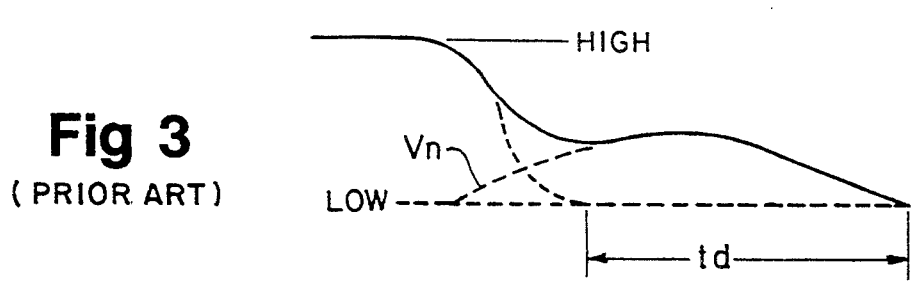
FIG. 3 is a wave form for illustrating the delayed operation caused by the counter-electromotive force induced in the conventional CMOS 3-state buffer circuit.
Figure 4:
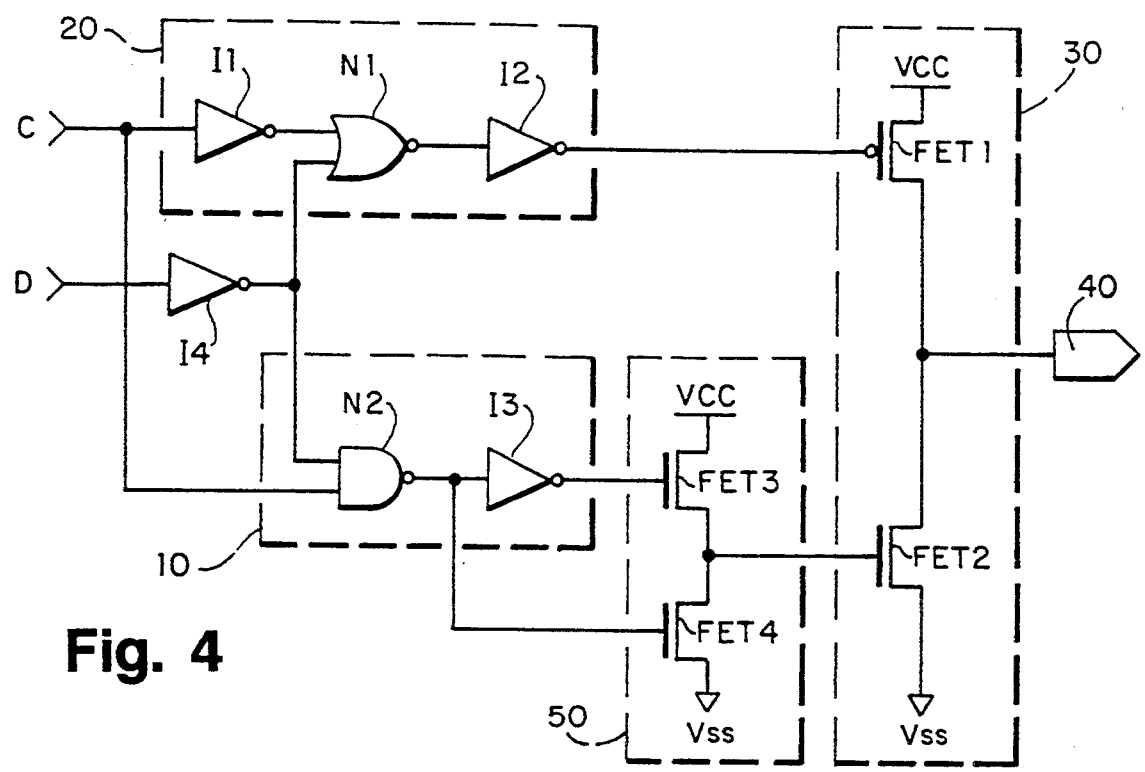
FIG. 4 is a circuit diagram of a CMOS 3-state buffer circuit according to the present invention.

FIG. 4 illustrates a CMOS 3-state buffer circuit in accordance with the present invention, in which subsidiary drive circuit 50 is additionally connected between second control circuit 10 and drive circuit 30 of the conventional CMOS 3-state buffer circuit (for example, as discussed above in connection with FIG. 1). Subsidiary drive circuit 50 consists of two NMOS transistors FET3 and FET4, which are connected in series. The gate of ground-side transistor FET4 of subsidiary circuit 50 is connected to the output of NAND gate N2 of second control circuit 10. The output of invertor I3 of second control circuit 10 is connected to the gate of Vcc-side transistor FET3 of subsidiary drive circuit 50. An output terminal of subsidiary drive circuit 50 is connected to the gate of output transistor FET2 of drive circuit 30.

A CMOS 3-state buffer circuit of the present invention constructed as above is operated as follows. When 3-state buffer control signal C is at a "low" level, since the output of first control circuit 20 becomes a "high" level, transistor FET1 (PMOS transistor) of drive circuit 30 becomes in the OFF state. As the output of second control circuit 10 becomes a "low" level, transistor FET3, which has its gate connected to the output of second control circuit 10 (connected to the output of invertor I3), also becomes in the OFF state. With transistor FET3 being connected to Vcc as shown, and ground side transistor FET4 of subsidiary drive circuit 50 having its gate connected to the output of NAND gate N2 of second control circuit 10, transistor FET4 is turned ON, whereby ground side transistor FET2 of drive circuit 30 becomes in the OFF state. As a result, output terminal 40 remains in a "high" impedance state irrespective of the state of input data D.

On the other hand, when control signal C of the 3-state buffer circuit is at a "high" level, NOR gate N1 and NAND gate N2 become enabled, and output terminal 40 at this time is determined as follows in accordance with the value of input data D. That is, when data D is at a "high" level, the output of first and second control circuits 20, 10 are respectively at a "low" level, and thus transistor FET3 of subsidiary drive circuit 50 is OFF, and transistor FET4 of subsidiary drive circuit 50 is ON, and therefore, output transistor FET2 of drive circuit 30 is OFF and output transistor FET1 of drive circuit 30 is ON, and the output signal of output terminal 40 becomes a "high" level.

When input data D is at a "low" level, the outputs of first and second control circuits 20, 10 are respectively at a "high" level, transistor FET3 of subsidiary drive circuit 50 is ON, transistor FET4 of subsidiary drive circuit 50 is OFF, transistor FET1 of drive circuit 30 is OFF, and transistor FET2 of drive circuit 30 is turned ON, and thus output terminal 40 becomes a "low" level.

Accordingly, when control signal C is "high" level, the output signal of output terminal 40 follows input data D.

Operation that reduces the counter-electromotive force Vn is as follows.

Figure 5A:
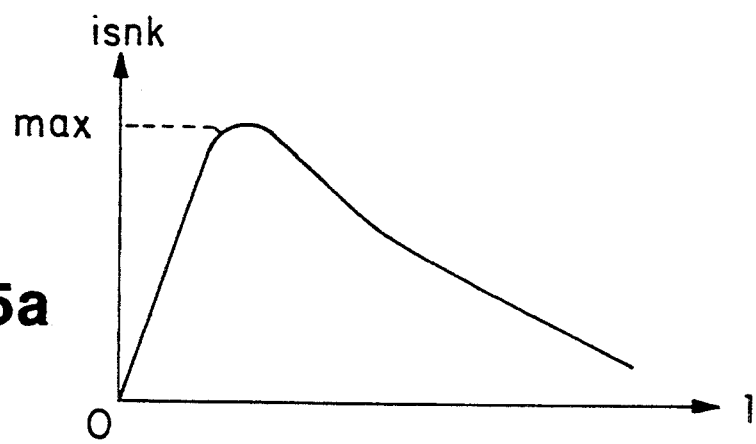
FIG. 5 (a) is wave form of sink current in the CMOS 3-state buffer circuit according to present invention.
Figure 5B:
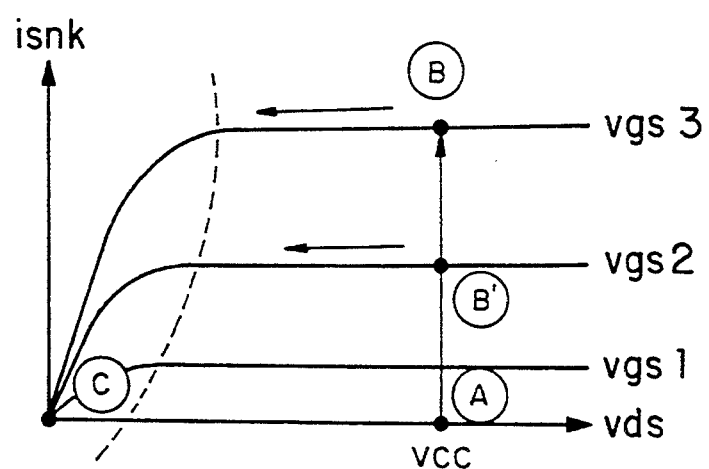

When the output signal of output terminal 40 makes a transition from a "high" to a "low" level, ground noise is generated by a counter-electromotive force generated by an expression of Vn=L di/dt (L is the equivalent inductance of the sink circuit), and the wave form of the current sink at this moment is illustrated in FIG. 5 (a). This sink current suddenly increases from the moment that transistor FET2 of drive circuit 30 becomes in an ON state, and simultaneously a current of maximum value flows and decreases as time elapses. The operation point of transistor FET2 moves from A to B to C as shown in FIG. 5 (b), where point B is an operation point of a saturated maximum current. If, however, the gate voltage indicated as Vgs2 is applied to the gate of transistor FET2, the maximum current is decreased to point B' as shown in FIG. 5 (b).

In the present invention, when the output signal of output terminal 40 makes a transition from a "high" level to a "low" level, since transistor FET3 of subsidiary drive circuit 50 determines the gate voltage (for example Vgs1, Vgs2, Vgs3, etc.) applied to transistor FET2 of drive circuit 30 due to Vcc−$V_{T3}$ ($V_{T3}$ is the threshold voltage of transistor FET3), a saturated current value (Id) of transistor FET2 of drive circuit 30 may be expressed as Id=k[(Vcc−$V_{T3}$)−$V_{T2}$]$^2$, and the current value of point B is lowered. Thus, the di/dt value of the current also is lowered, whereby the counter-electromotive force is decreased. Accordingly, the output delay in accordance with the counter-electromotive force and the ground noise also can be decreased.

As described above, according to the present invention, a voltage less than the power source voltage Vcc is applied to the gate of the output transistor connected to the ground side of the drive circuit, the saturated current in the sink circuit is reduced, and thus generation of the counter-electromotive force is reduced, so that reliability of the CMOS 3-state buffer circuit is improved.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. An operation method for controlling a CMOS 3-state buffer circuit, the buffer circuit having: a drive circuit with a PMOS transistor and a first NMOS transistor connected in series for providing a drive current to an output load through an output terminal; a first control circuit including a first inverter, a NOR gate, and a second inverter connected in series for controlling the PMOS transistor of the drive circuit; a second control circuit including a NAND gate and a third inverter connected in series for controlling the first NMOS transistor of the drive circuit; a data input terminal connected through a fourth inverter to a first input terminal of the NOR gate and to a first input terminal of the NAND gate; a control input terminal connected to a second input terminal of the NAND gate, and through the first inverter to a second input terminal of the NOR gate; and a power supply of a high voltage level and a low voltage level; the operation method characterized by applying a signal of the low voltage level from the second inverter to the PMOS transistor of the drive circuit to control the voltage on the output terminal to the high voltage level, and by applying signals from the NAND gate and the third inverter to series connected second and third NMOS transistors, the second and third NMOS transistors being series connected between the high voltage level and the low voltage level, wherein a signal of a voltage lower than the high voltage level by an amount determined by the threshold voltage of the third NMOS transistor is applied to the gate of the first NMOS transistor of the drive circuit to control the voltage on the output terminal to the low voltage level.

2. An improved buffer circuit connected to an output terminal, comprising:
   a drive circuit having a PMOS transistor and an NMOS transistor serially connected between a voltage source Vcc and ground potential, the drive circuit providing a drive current to the output terminal;
   a first control circuit having a first inverter, a NOR gate, and a second inverter connected in series for controlling the PMOS transistor of the drive circuit;
   a second control circuit having a NAND gate and a third inverter connected in series for controlling the NMOS transistor of the drive circuit;
   a data input terminal connected through a fourth inverter to a first input terminal of the NOR gate and a first input terminal of the NAND gate; and
   a control input terminal connected to a second input terminal of the NAND gate and connected through the first inverter to a second input terminal of the NOR gate;
   the buffer circuit further comprising a subsidiary drive circuit connected between the second control circuit and the NMOS transistor of the drive circuit, the subsidiary drive circuit providing a signal of a voltage less than the power source Vcc to the gate of the NMOS transistor of the drive circuit.

3. The buffer circuit of claim 2, wherein the subsidiary drive circuit comprises third and fourth NMOS transistors connected in series between voltage source Vcc and ground potential, wherein the output of the third inverter of the second control circuit is connected to the gate of the third transistor, and an output terminal of the NAND gate of the second control circuit is connected to the gate of the fourth transistor, and an output terminal of the subsidiary drive circuit is connected to the gate of the NMOS transistor of the drive circuit.

4. The buffer circuit of claim 3, wherein the third transistor has a threshold voltage of Vth, wherein a signal of voltage Vcc minus Vth is provided by the subsidiary drive circuit to the gate of the NMOS transistor of the drive circuit.

5. A buffer circuit connected to an output terminal comprising:
   an input terminal for receiving an input data signal;
   a control terminal for receiving a control signal;
   a drive circuit having a PMOS transistor and an NMOS transistor connected in series, the source of the PMOS transistor being coupled to a power supply and the source of the NMOS transistor being coupled to a reference voltage supply, the drains of the PMOS and NMOS transistors being connected to the output terminal;
   a first control circuit connected to the input terminal, the control terminal and the gate of the PMOS transistor;
   a second control circuit connected to the input terminal, the control terminal and the gate of the NMOS transistor, the second control circuit being coupled to a voltage source of voltage Vcc, the second control circuit comprising two MOS transistors each having a threshold voltage, wherein the two MOS transistors are connected in series between the power supply and the reference voltage supply, wherein the second control circuit provides a signal of a voltage less than the power supply voltage to the gate of the NMOS transistor, wherein the voltage of the signal applied to the gate of the NMOS transistor is determined by the power supply voltage and the threshold voltage of one of the MOS transistors.

6. The buffer circuit of claim 5, wherein the second control circuit comprises a first NMOS transistor having a threshold voltage Vth, wherein the drain of the first NMOS transistor is connected to the power supply voltage Vcc and the source of the first NMOS transistor is connected to the gate of the NMOS transistor of the drive circuit, wherein a signal of a voltage of Vcc minus Vth is applied to the gate of the NMOS transistor of the drive circuit.

7. The buffer circuit of claim 6, wherein the first control circuit comprises a first inverter, a NOR gate N1, and a second inverter connected in series, and the second control circuit comprises a NAND gate and a third inverter connected in series.

* * * * *